(12) United States Patent
Kawamoto et al.

(10) Patent No.: US 6,523,258 B2
(45) Date of Patent: Feb. 25, 2003

(54) METHOD OF MANUFACTURING PRINTED CIRCUIT BOARD

(75) Inventors: Eiji Kawamoto, Osaka (JP); Shigeru Yamane, Osaka (JP); Toshiaki Takenaka, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/799,812

(22) Filed: Mar. 7, 2001

(65) Prior Publication Data

US 2001/0025415 A1 Oct. 4, 2001

(30) Foreign Application Priority Data

Mar. 13, 2000 (JP) ........................................ 2000-068319

(51) Int. Cl.⁷ ................................................. H05K 3/02
(52) U.S. Cl. ............................. 29/852; 29/825; 29/846
(58) Field of Search ......................... 29/825, 830, 846, 29/852, 853; 427/97, 96, 98; 174/260

(56) References Cited

U.S. PATENT DOCUMENTS 4,931,134 A * 6/1990 Hatkevitz et al. ............. 29/846
5,481,795 A * 1/1996 Hatakeyama et al. ......... 29/852
5,888,627 A * 3/1999 Nakatani ...................... 29/830
6,009,620 A * 1/2000 Bhatt et al. ................... 29/852

FOREIGN PATENT DOCUMENTS

JP          6-268345          9/1994

* cited by examiner

Primary Examiner—Gregory Wilson
(74) Attorney, Agent, or Firm—McDermott, Will & Emery

(57) ABSTRACT

A method of performing a printed circuit board including the steps of: (a) disposing a first release film on the surface of a substrate and a second release film on the back of the substrate; (b) forming a through-hole in the first release film, the second release film, and the substrate; (c) filling conductive paste into a through-hole; (d) removing the first release film and the second release film from the substrate with the through-hole filled with the conductive paste; (e) placing a first metallic member on the surface of the substrate with the release films removed and placing a second metallic member on the back of the substrate; (f) compressing under heat the substrate with the first metallic member and the second metallic member disposed thereon; and (g) forming a desired circuit pattern on the first metallic member and the second metallic member.

20 Claims, 5 Drawing Sheets

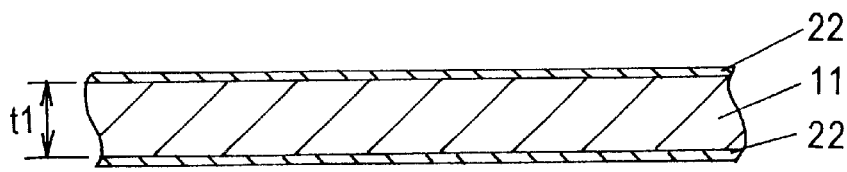
Fig. 5(a) (PRIOR ART)
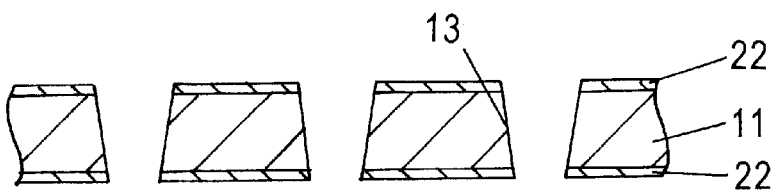
Fig. 5(b) (PRIOR ART)
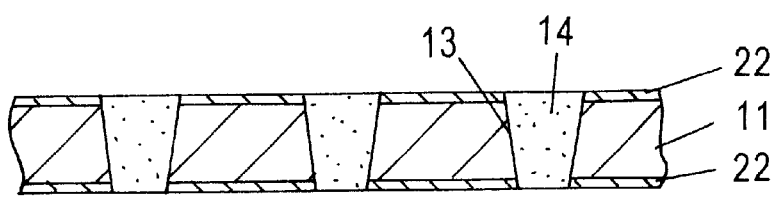
Fig. 5(c) (PRIOR ART)
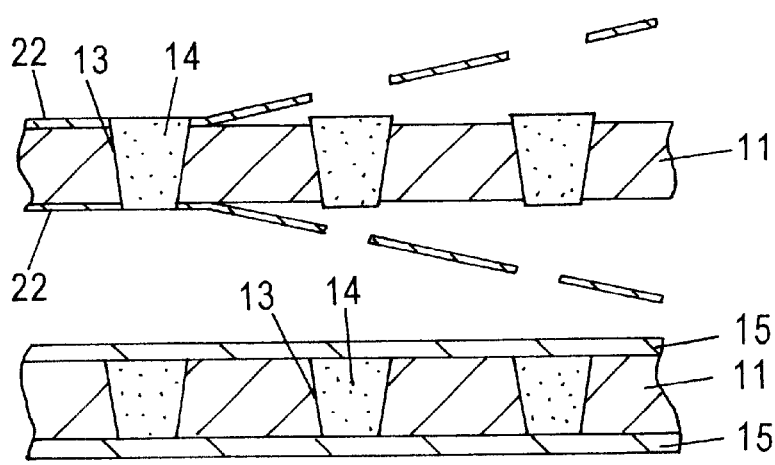
Fig. 5(d) (PRIOR ART)
Fig. 5(e) (PRIOR ART)
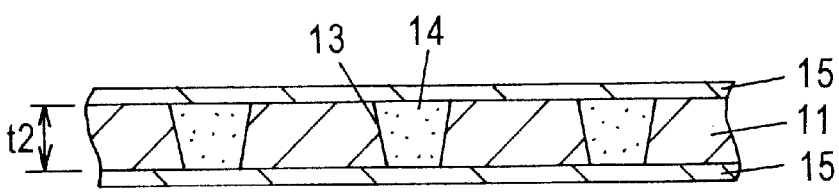
Fig. 5(f) (PRIOR ART)
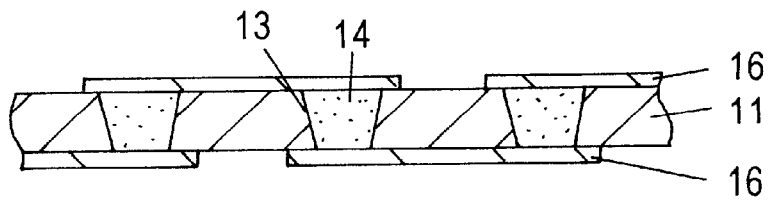
Fig. 5(g) (PRIOR ART)

METHOD OF MANUFACTURING PRINTED CIRCUIT BOARD

FIELD OF THE INVENTION

The present invention relates to a method of manufacturing a printed circuit board having inner via-holes.

BACKGROUND OF THE INVENTION

In recent years, due to the miniaturization and multiple functions of electronic equipment, printed circuit boards have been increasingly becoming multi-layered and higher in component density.

Generally, a method of manufacturing a printed circuit board comprises a step of alternately laminating a plurality of boards with conductor circuits and adhesive sheets (usually called "prepreg"), a step of press-fitting under heat, followed by a step of making a through-hole therein, and a step of making electrical connections between surface and inner layers by means of copper plating or the like in the through-hole.

However, with increase in demand for video movie cameras and mobile communication equipment or the like, printed circuit boards used for these cameras and equipment have been required to be smaller in size and higher in density. To meet such requirement, there is a proposal of a method for manufacturing a printed circuit board disclosed in Japanese Laid-open Patent No. 6-268345. The method of manufacturing a printed circuit board in Japanese Laid-open Patent No.6-268345 comprises a step of making a through-hole in a non-compressible porous substrate having release film on either side thereof, a step of filling conductive paste into the through-hole, a step of electrically connecting both sides of the board to each other by sticking metallic foil on either side of the porous substrate and pressurizing same under heat after peeling the release film, and a step of patterning by itching the metallic foil to form a circuit.

A conventional method of manufacturing a printed circuit board will be described in the following with reference to the drawings. FIG. 3 to FIG. 5 show cross-sectional views of manufacturing steps for a conventional printed circuit board. First, as shown in FIG. 3(a), release film 12 is disposed on either side of porous substrate (hereinafter referred to as "prepreg sheet") 11. The porous substrate 11 has a square plane, which is 500 mm in side length and t1 (for example, about 150 µm) in thickness. The release film 12 includes polymer film such as PET (polyethylene terephthalate) of 19 µm thick, having a silicone-based release layer disposed on one side thereof. Prepreg sheet 11 used is a composite material consisting of non-woven cloth of aromatic polyamide fiber and thermosetting epoxy resin with which the non-woven cloth is impregnated.

Next, as shown in FIG. 3(b), through-hole 13 is formed in a predetermined portion of the prepreg sheet 11 by laser operation.

Subsequently, the prepreg sheet 11 is placed on a table of a printing machine (not shown), and conductive paste 14 is printed on the release film 12. Then, as shown in FIG.(c), the conductive paste 14 is filled into the through-hole 13. In this case, the release film 12 serves to prevent staining of a printing mask and prepreg sheet 11.

Next, as shown in FIG. 3(d), the release film 12 on either side of the prepreg sheet 11 is removed at the room temperature. And, as shown in FIG. 3(e), metallic foil 15 such as copper foil is stuck on either side of the prepreg sheet 11 and is pressurized under heat. In this way, as shown in FIG. 3(f), the prepreg sheet 11 and the metallic foil 15 are adhered to each other, and the prepreg sheet 11 is compressed to t2 (for example, about 100 µm) in thickness (t2>t2), then the metallic foils 15 on either side of same are electrically connected to each other by conductive paste 14. At that time, epoxy resin, that is one of the components of the prepreg sheet 11, and the conductive paste 14 become hardened.

And, as shown in FIG. 3(g), the metallic foil 5 is subjected to patterning by photolithography, followed by etching, and thereby, circuit pattern 16 is formed on either side of the prepreg sheet 11.

However, in the conventional configuration described above, through-holes in a prepreg sheet are reduced in diameter as a result of increasing in density of the circuit pattern, and after filling conductive paste, when the release film is removed from the prepreg sheet 11, the conductive paste sticking to the release film is removed from the prepreg sheet along with the release film. A possible cause of this problem is that reducing only the through-hole diameter by using conventional release film mainly to meet the requirement for reducing the through-hole diameter causes the through-hole diameter to be excessively reduced as compared with the thickness of the release film, that is, the aspect ratio (the ratio of the diameter of the hole formed in the release film to the thickness of the release film) becomes greater. Accordingly, it is not possible to make the conductive paste projected in convexity from the surface of the prepreg sheet after removal of the release film. If the worse comes to the worst, as shown in FIG. 4(d), the conductive paste will be concavely curved from the uppermost surface of the prepreg sheet, thereby forming a depletion layer 18. Consequently, it becomes difficult to make electrical connections between the conductive paste and the metallic foil in the following steps.

Also, as shown in FIG. 5, for preventing removal of the conductive paste during release film peeling operation, it is possible to lower the aspect ratio by using thinner release film. However, when thinner release film 22 is used, the amount of conductive paste projected from the prepreg sheet will become less. As a result, the absolute amount of conductive paste that should exist in the through-hole after compression by pressure application becomes insufficient. Accordingly, the connection resistance between the metallic foil and the conductive paste will increase.

SUMMARY OF THE INVENTION

A method of manufacturing a printed circuit board of the present invention comprises:

(a) a step of disposing a first release film on a surface of a substrate, and disposing a second release film on a back surface of the substrate;

(b) a step of forming a through-hole through the first release film, the second release film and the substrate;

(c) a step of filling conductive paste into the through-hole;

(d) a step of peeling the first release film and the second release film from the substrate with the through-hole filled with the conductive paste;

(e) a step of placing a first metallic member on the surface of the substrate with the release films removed, and placing a second metallic member on the back surface of the substrate;

(f) a step of compressing under heat the substrate with the first metallic member and the second metallic member disposed on either side thereof; and (g) a step of forming a desired circuit pattern on the first metallic member and the second metallic member, wherein the thickness of the first release film is different from the thickness of the second release film;

when the first release film is peeled, a first projected paste portion is formed, which is projected from the surface of the substrate having the through-hole, and a second projected paste portion is formed, which is projected from the back surface of the substrate having the through-hole; and the first metallic member is electrically connected to the first projected paste portion, and the second metallic member is electrically connected to the second projected paste portion.

Preferably, the thickness of the first release film is greater than the thickness of the second release film, the thickness of the first projected paste portion depends upon the thickness of the first release film, the thickness of the second projected paste portion depends upon the thickness of the second release film, and the thickness of the first projected paste portion is greater than the thickness of the second projected paste portion.

Preferably, a step of forming the through-hole is performed by application of a laser beam, and the laser beam is applied from the first release film side being greater in thickness toward the first release film, the substrate, and the second release film. In this way, a first through-hole in the first release film is formed larger in diameter than a second through-hole in the second release film.

With the above configuration, the conductive paste is disposed on the substrate in a manner such that the first projected paste portion and the second projected paste portion being desirable in thickness are projected from the substrate. And, each of the metallic members is precisely electrically connected to the conductive paste filled in the through-hole. As a result, the circuit pattern disposed on the surface of the substrate is precisely electrically connected to the circuit pattern disposed on the back of the substrate, thereby preventing increase in electrical resistance between the circuits. Further, even in case the printed circuit board has a small-diameter through-hole corresponding to a high-density circuit pattern, the conductive paste may be reliably filled into the through-hole. As a result, it is possible to make reliable electrical connections between the metallic member on either side of the substrate and the conductive paste.

BRIEF DESCRIPTION OF THE DRAWINGS

FIG. 5 is a cross-sectional view of a step for manufacturing a printed circuit board in further another prior art.

DESCRIPTION OF THE REFERENCE NUMERALS

Figure 1A:
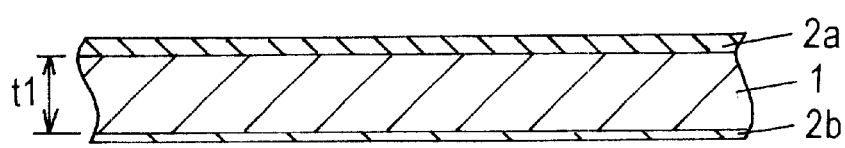
FIG. 1 shows cross-sectional views of a step for manufacturing a printed circuit board in an embodiment of the present invention.

1 Prepreg sheet
2a First release film
2b Second release film
3 Through-hole
3a First through-hole (through-hole formed in first release film)
3b Second through-hole (through-hole formed in second release film)
4 Conductive paste
4a First projected paste portion
4b Second projected paste portion
5a First metallic foil
5b Second metallic foil
6a First circuit pattern
6b Second circuit pattern
7a1 Affected layer
7a2 Affected layer
7b1 Affected layer
7b2 Affected layer
32 Laser beam

DETAILED DESCRIPTION OF THE INVENTION

A method of manufacturing a printed circuit board in an embodiment of the present invention comprises:

(a) a step of disposing a first release film on a surface (first surface) of a substrate, and disposing a second release film on the back surface (second surface) of the substrate;

(b) a step of forming a through-hole through the first release film, the second release film and the substrate;

(c) a step of filling conductive paste into the through-hole;

(d) a step of peeling the first release film and the second release film from the substrate with the through-hole filled with the conductive paste;

(e) a step of placing a first metallic member on the surface of the substrate with the release films removed, and placing a second metallic member on the back surface of the substrate;

(f) a step of compressing under heat the substrate with the first metallic member and the second metallic member disposed on either side thereof; and (g) a step of forming a desired circuit pattern on the first metallic member and the second metallic member, wherein the thickness of the first release film is different from the thickness of the second release film;

when the first release film is peeled, a first projected paste portion is formed, which is projected from the surface of the substrate having the through-hole, and a second projected paste portion is formed, which is projected from the back surface of the substrate having the through-hole; and the first metallic member is electrically connected to the first projected paste portion, and the second metallic member is electrically connected to the second projected paste portion.

With this configuration, when the first release film and the second release film are removed from a porous substrate, either of the first projected paste portion filled so as to project from the through-hole in the first surface of the porous substrate and the second projected paste portion filled so as to project from the through-hole in the second surface of the substrate is more in number than the other. Therefore, when metallic foil is connected to conductive paste filled in a through-hole, one of the projected paste portions makes up for the shortage of paste at the other projected paste portion. Accordingly, a stable supply of conductive paste may be assured as a whole. As a result, it is possible to remarkably improve the electrical connections between the conductive member (conductive member generated due to hardening of conductive paste) and the metallic foil after compressing the metallic foil and porous substrate.

Preferably, the substrate includes a porous substrate having compressibility, and in the step of compressing under heat the substrate with the first metallic member and the second metallic member disposed on either side thereof as in the (f) step, the substrate is compressed, hardened, and formed into a substrate decreased in thickness, the first metallic member is electrically connected to the conductive paste, and the second metallic member is electrically connected to the conductive paste.

Preferably, the substrate includes prepreg, and the prepreg includes a porous substrate having compressibility, and prepolymer with which the porous substrate is impregnated.

Preferably, the metallic member is metallic foil.

Preferably, the thickness of the first release film is greater than the thickness of the second release film; the thickness of the first projected paste portion depends upon the thickness of the first release film; the thickness of the second projected paste portion depends upon the thickness of the second release film; and the thickness of the first projected paste portion is greater than the thickness of the second projected paste portion.

With this configuration, because of the inherent peculiarity of a laser beam, the hole in release film is smaller in diameter at the back side of the substrate as compared with the side exposed to the laser beam, and therefore, the aspect ratio becomes smaller when release film is more reduced in thickness at the back side of the substrate than at the side exposed to the laser beam, and when the second release film is removed from the porous substrate, the conductive paste filled in the through-hole may be prevented from sticking to the second release film and being removed along with the second release film. Accordingly, the conductive paste is kept projecting from both surfaces of the porous substrate, and it is possible to make reliable electrical connections between the conductive paste and the metallic foil in a step of disposing metallic foil on a porous substrate.

Preferably, a step of forming the through-hole is performed by application of a laser beam. The laser beam is applied from the first release film side being greater in thickness toward the first release film, the substrate, and the second release film. In this way, the through-hole in the first release film is formed larger in diameter than the through-hole in the second release film.

Preferably, the diameter of the through-hole is about 200 $\mu$m or less. Further preferably, the diameter of the through-hole is preferable to be in a range from about 20 $\mu$m to about 200 $\mu$m. With this configuration, even in case of a very small through-hole whose diameter is 200 $\mu$m or less, when the release films are removed from the substrate, the conductive paste may be prevented from sticking to the release films and being removed along with the release films. As a result, the electrical connections between the conductive paste and the metallic foil will be improved. Also, even in case of a very large through-hole whose diameter is over 200 $\mu$m, the same result as mentioned above will be obtained. In this respect, the result obtained is especially excellent when the diameter of the through-hole is less than 200 $\mu$m. However, in case of a very small through-hole whose diameter is less than 20 $\mu$m, the conductive paste will not be sufficiently filled into the through-hole.

Preferably, the first release film disposed on the side (first surface) exposed to the laser beam is about 15 $\mu$m or over in thickness. Further, the thickness of the first release film is preferable to be in a range from about 15 $\mu$m to about 30 $\mu$m. With this configuration, an optimum first projected paste portion will be formed. Furthermore, when the release films are removed from the substrate, the amount of conductive paste at the first projected past portion disposed so as to project from the first surface of the substrate makes up for the amount of conductive paste at the second projected paste portion disposed so as to project from the second surface of the substrate. Accordingly, the amount of conductive paste filled into the through-hole may be stabilized as a whole. Consequently, the electrical connections between the conductive paste and the metallic foil will be further stabilized in a step of disposing metallic foil on a porous substrate. When the first release film exceeds about 30 $\mu$m in thickness, the aspect ratio becomes greater, causing easier removal of conductive paste together with the first release film peeled, and when the thickness of same is less than about 15 $\mu$m, the effect of compensation for the shortage of conductive paste at the second projected paste portion will become less.

Preferably, the second release film disposed on the second surface (back side) of the porous substrate is about 20 $\mu$m or less in thickness. Further, the thickness of the second release film is preferable to be in a range from about 5 $\mu$m to about 20 $\mu$m. With this configuration, an optimum second projected paste portion will be formed. Furthermore, when the release films are removed from the substrate, the conductive paste may be prevented from sticking to the release films and being removed along with the release films. Consequently, the electrical connections between the conductive paste and the metallic foil will be further improved. When the second release film exceeds about 20 $\mu$m in thickness, the aspect ratio becomes greater, causing easier removal of conductive paste together with the second release film peeled, and when the thickness of same is less than about 5 $\mu$m, the shortage of conductive paste at the second projected paste portion will be increased.

Preferably, the relations between the thickness "th" of the affected layer generated around the opening of the through-hole formed in at least one release film out of the first release film and the second release film, the thickness "tf" of the release film, and the diameter "d" of the opening of the through-hole in the release film can be represented by $(th+tf)/d \leq 0.4$.

By this method, it is possible to prevent conductive paste from sticking to release film and being removed along with the release film peeled. Further, the conductive paste is reliably formed in convexity projecting from the porous substrate. Furthermore, when the conductive paste is not sufficiently projected due to the second release film decreased in thickness on the back side of the substrate, it is possible to make up for the shortage of conductive paste at the second projected paste portion by thickening the first release film on the surface side of the substrate. Accordingly, the electrical connections between the conductive paste and the metallic foil may be further improved even after compressing the porous substrate.

That is, the relations between the thickness "th" of the affected layer generated around the opening of the through-hole formed in each of the release films, the thickness "tf" of each release film, and the diameter "d" of the opening in the through-hole formed in each release film can be represented by $(th+tf)/d \leq 0.4$. Namely, the aspect ratio is prescribed so that the total thickness around the opening in the release film including the affected layer of the release film, generated when the through-hole is formed by laser operation, becomes less than 40% of the diameter of the opening in the release film. With this configuration, in case of a very small through-hole of less than 200 μm in diameter, the conductive paste may be prevented from sticking to the release films and being removed along with the release films peeled. As a result, the electrical connections between the conductive paste and the metallic foil will be further improved.

Preferably, each release film is formed of organic polymer film. With this configuration, it is easier to make release films which are different in thickness.

Preferably, the laser beam includes at least any one of carbonic acid gas laser, YAG laser, and excimer laser beams. With this configuration, a high energy beam may be obtained. As a result, it is possible to form a very small through-hole.

An embodiment of the present invention will be described in the following with reference to FIG. 1 and FIG. 2. FIG. 1 shows cross-sectional views of a step for manufacturing a printed circuit board in the embodiment 1 of the present invention.

First, as shown in FIG. 1(a), first release film 2a is stuck on the surface (first surface) of prepreg sheet 1 used as a substrate, and second release film 2b is stuck on the back (second surface) of the prepreg sheet 1. The prepreg sheet 1 includes non-woven cloth of porous aromatic polyamide fiber, and thermosetting epoxy resin with which the non-woven cloth is impregnated. The prepreg sheet 1 has a generally square plane in a plan view, and is about 500 mm in side length and about 150 μm in thickness "t1". The first release film 2a includes polymer film such as PET (polyethylene terephthalate), 19 μm in thickness, and silicone-based release layer of about 100 Å in thickness stuck on the surface of the polymer film. The release layer side is stuck on the surface of prepreg sheet 1. The second release film 2b includes polymer film such as PET (polyethylene terephthalate), 12 μm in thickness, and silicone-based release layer of about 100 Å in thickness stuck on the surface of the polymer film. The release film side is stuck on the back of prepreg sheet 1. That is, the first release film 2a is thicker than the second release film 2b.

Thus, it is important for the first release film 2a to be thicker than the second release film 2b. Preferably, the thickness of the first release film 2a to be stuck on the surface of prepreg sheet 1 is greater than the thickness of the second release film 2b to be stuck on the back of prepreg sheet 1.

Also, the first release film 2a and the second release film 2b are simultaneously stuck on the prepreg sheet 1. Or, one of the first release film 2a and the second release film 2b is first stuck on the prepreg sheet 1, and after that, the other film is stuck on the prepreg sheet 1.

PET, PI (polyimide), PEN (polyethylene naphthalate), PPS (polyphenylene sulfite), and PP (polypropylene), PPO (polyphenylene oxide) can be used as polymer film. And, the prepreg sheet 1 includes a porous substrate having compressibility, and prepolymer with which the porous substrate is impregnated. Fiber polymers such as aromatic polyamide fiber, glass fiber, ceramic fiber, inorganic fiber are used as a porous substrate. As prepolymer, thermosetting resin capable of hardening can be used. Epoxy resin, non-saturated polyester resin, and phenol resin are used as thermosetting resin. Prepolymer is semi-hardened resin before complete hardening. That is, the prepreg sheet 1 including prepolymer can be hardened by thermosetting or the like in a step of manufacturing described hereinafter.

Figure 1B:
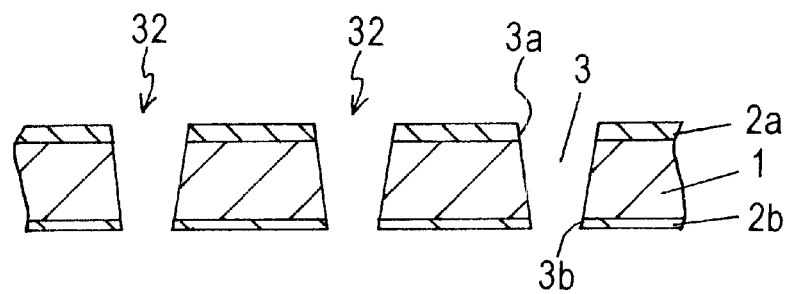

Next, as shown in FIG. 1(b), a through-hole 3 is formed by applying a laser beam 32 from the surface (first surface) side of prepreg sheet 1 to the predetermined portion of prepreg sheet 1 with first release film 2a and second release film 2b disposed thereon. The through-hole 3 includes first through-hole 3a formed in the first release film 2a, and second through-hole 3b formed in the second release film 2b. The most important thing is to apply the laser beam 32 from the surface (first surface) side of prepreg sheet 1. That is, it is necessary to apply the laser beam 32 from the first release film 2a side where the film is thicker. In laser beam application to make a hole, the strength of the laser beam attenuates in accordance with the distance. Accordingly, when the through-hole 3 is formed by applying the laser beam from the surface side of the prepreg sheet, the first through-hole 3a positioned at the surface side of prepreg sheet 1 becomes larger than the second through-hole 3b positioned at the back side of prepreg sheet 1. That is, the through-hole 3 is not cylindrical but trapezoidal in section such that the opening diameter at the surface side is larger than the opening diameter at the back side. Accordingly, at the through-hole 3 formed by applying the laser beam 32 from the first release film 2a side where the film is thicker, the bore diameter of the first through-hole 3a in the first release film 2a disposed on the surface (first surface) of prepreg sheet 1 is larger than the bore diameter of the second through-hole 3b in the second release film 2b disposed on the back surface (second surface) of prepreg sheet 1. The through-hole 3 serves a function as an inner via-hole for the printed circuit board.

Carbonic acid gas laser, YAG laser, excimer laser beams or the like can be used as a laser beam.

On the other hand, when the through-hole is formed by applying the laser beam from the second release film 2b side where the film is thinner, the bore diameter of the first through-hole 3a formed in the first release film 2a where the film is thicker becomes smaller than the bore diameter of the second through-hole 3b formed in the second release film 2b. Therefore, the thickness of the first release film 2a becomes greater as against the bore diameter of the through-hole 3a formed in the first release film 2a. That is, the aspect ratio becomes greater, and consequently, when the first release film 2a is peeled, conductive paste 4 is hard to remove from the first release film 2a. In order to prevent generation of such problem, it is important to form the through-hole by applying the laser beam from the first release film 2a side where the film is thicker.

Figure 1C:
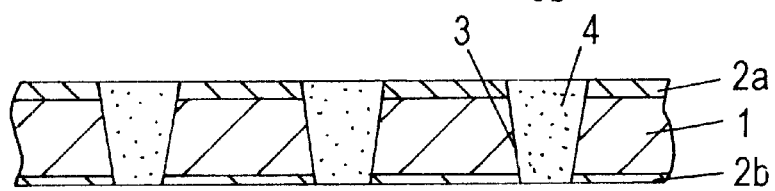

Next, as shown in FIG. 1(c), prepreg sheet 1 having release film 2a, 2b is placed on a table of a printing machine (not shown), and conductive paste 4 is printed on at least one of the first release film 2a and second release film 2b, and then, the conductive paste 4 is filled into the through-hole 3. In that case, the conductive paste 4 is filled into the first through-hole 3a and second through-hole 3b. In this printing operation, the conductive paste 4 is printed from the first release film 2a side, or the second release film 2b side, or from both the first release film side 2a side and the second release film 2b side. Most preferably, the conductive paste 4 is printed from the first release film 2a side. Thus, the conductive paste 4 is reliably and precisely filled into the through-hole 3. Also, in the printing process, each of the first release film 2a and second release film 2b serves a function as a printing mask and, at the same time, a function to prevent staining of the prepreg sheet 1.

Figure 1D:
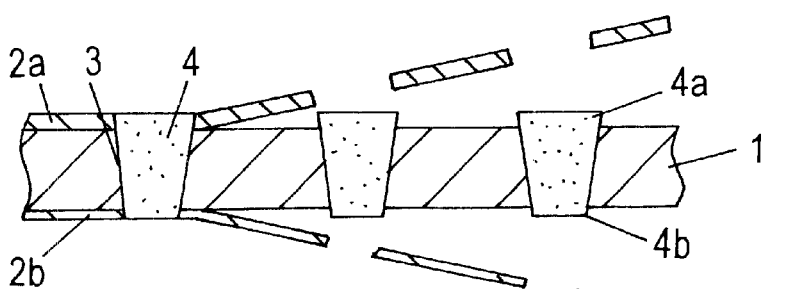

After that, as shown in FIG. 1(d), the first release film 2a and the second release film 2b are removed from the prepreg sheet 1. After removal of the release films 2a and 2b, the conductive paste 4 is filled into the through-hole 3, then including first projected paste portion 4a projecting from the surface of prepreg sheet 1 and second projected paste portion 4b projecting from the back of prepreg sheet 1. The height of the first projected paste portion 4a depends upon the thickness of the first release film 2a and the affected layer thickness, while the height of the second projected paste portion 4b depends upon the thickness of the second release film 2b and the affected layer thickness. Accordingly, the first projected paste portion 4a is more in amount of paste than the second projected paste portion 4b. That is, since the second release film 2b is thinner, the conductive paste 4 can be kept projecting in convexity from the back of prepreg sheet 1 after removal of the second release film 2b. Also, since the second release film 2b is thinner, the conductive paste 4 is less at the second projected paste portion 4b projecting from the back of prepreg sheet 1. However, since the first release film 2a is thicker than the second release film 2b, the conductive paste 4 of the first projected paste portion 4a projecting from the surface of prepreg sheet 1 is more than the conductive paste 4 of the second projected paste portion 4b. Therefore, the conductive paste on the surface (first surface) side of prepreg sheet 1 is able to make up for the shortage of conductive paste on the back (second surface) side of prepreg sheet 1. As a result, it is possible to keep constant the absolute amount of the conductive paste 4 compressed into the through-hole 3 in a step of compressing described hereinafter.

Figure 1E:
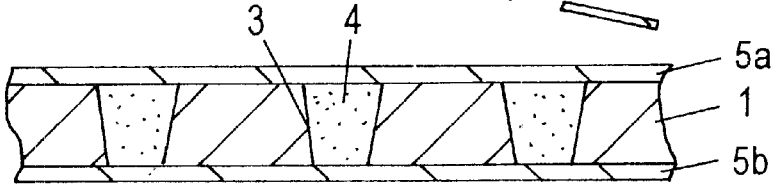

Next, as shown in FIG. 1(e), first metallic foil 5a as a metallic member is stuck on the surface (first surface) of prepreg sheet 1, covering the conductive paste of the first projected paste portion 4a. And, second metallic foil 5b as a metallic member is stuck on the back surface (second surface) of prepreg sheet 1, covering the conductive paste of the second projected paste portion 4b. In this embodiment, each metallic member of the first metallic foil 5a and the second metallic foil 5b is copper foil of about 18 μm in thickness. Also, the prepreg sheet 1 with the first metallic foil 5a and second metallic foil 5b stuck thereon is pressurized under heat. That is, the prepreg sheet is compressed while being heated.

Figure 1F:
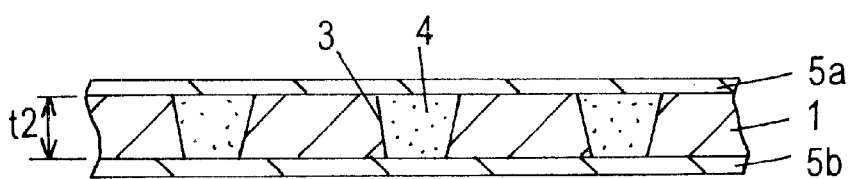

By the above step (e), as shown in FIG. 1(f), the first metallic foil 5a and the second metallic foil 5b are adhered to the prepreg sheet 1. The prepreg sheet 1 is compressed to thickness "t2", and also, epoxy resin contained in the prepreg sheet 1 is hardened to form a board. Further, the conductive paste 4 is hardened to form a conductive member. In this way, the first metallic foil 5a is mechanically and electrically connected to the second metallic foil 5b by the conductive member filled in through-hole 3. In this case, the relation between the thickness "t1" before compression of prepreg sheet 1 and about 100 μm in thickness "t2" after compression of prepreg sheet 1 is "t1>t2."

Figure 1G:
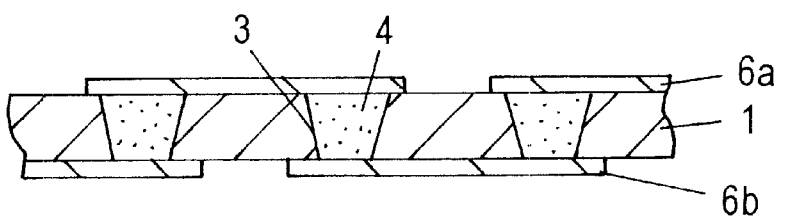

Next, as shown in FIG. 1(g), each metallic member of the first metallic foil 5a and the second metallic foil 5b is selectively subjected to etching. Thus, first circuit pattern 6a is formed on the first metallic foil 5a, and second circuit patter 6b is formed on the second metallic foil 5b. A printed circuit board can be obtained through these steps.

Figure 2A:
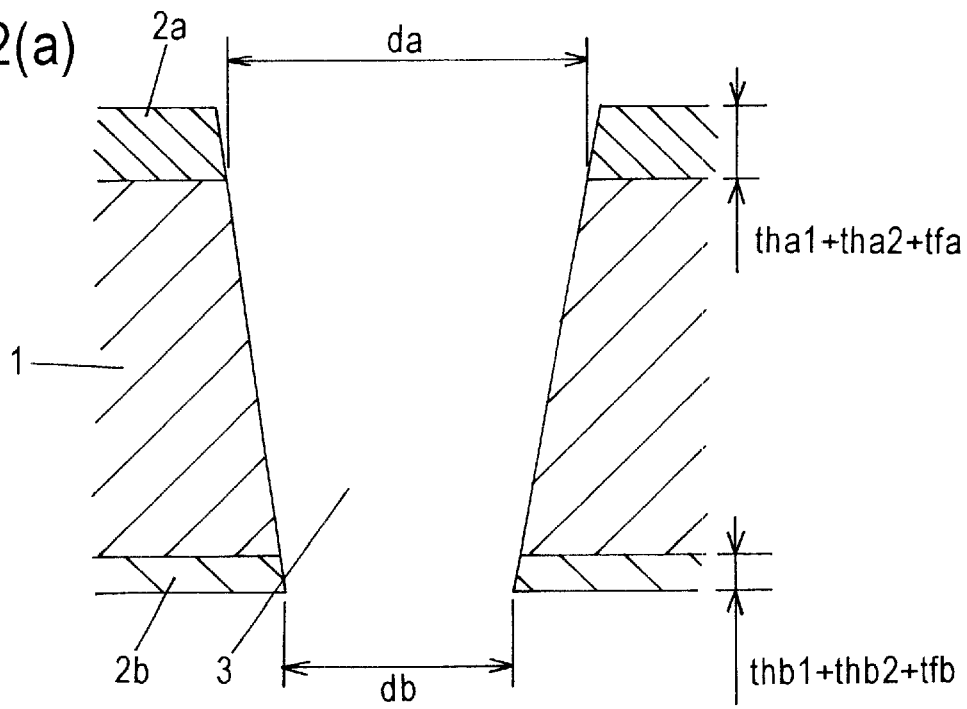
FIG. 2(a) is a cross-sectional view showing a portion around a through-hole in a printed circuit board in a step for manufacturing a printed circuit board in an embodiment of the present invention.
Figure 2B:
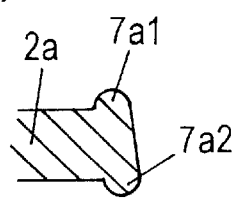
FIG. 2(b) to FIG 2(e) are enlarged views of a portion around an opening in release film.
Figure 2D:
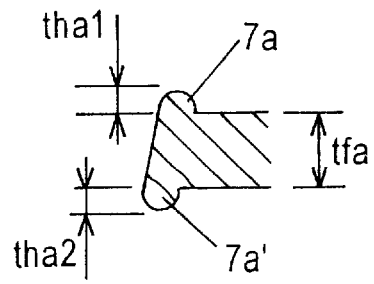
Figure 2C:
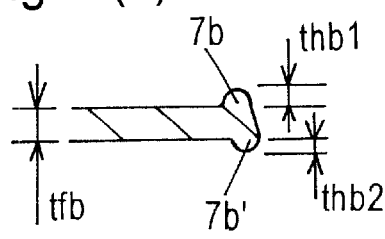
Figure 2E:
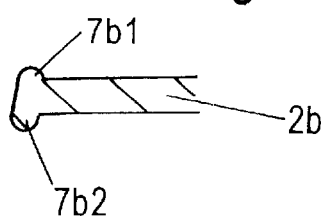
Figure 3A:
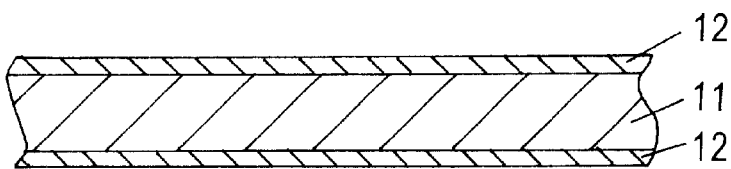
FIG. 3 is a cross-sectional view of a step for manufacturing a printed circuit board in prior art.
Figure 3B:
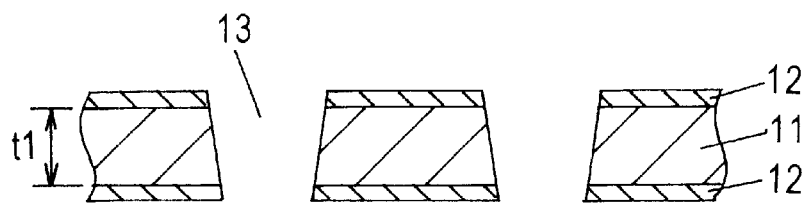
Figure 3C:
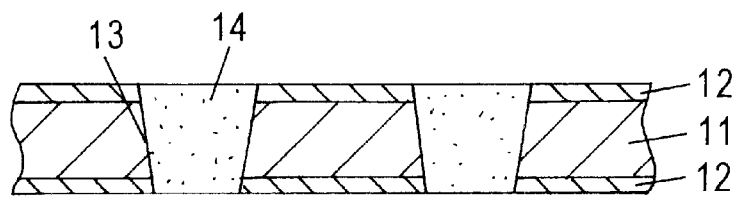
Figure 3D:
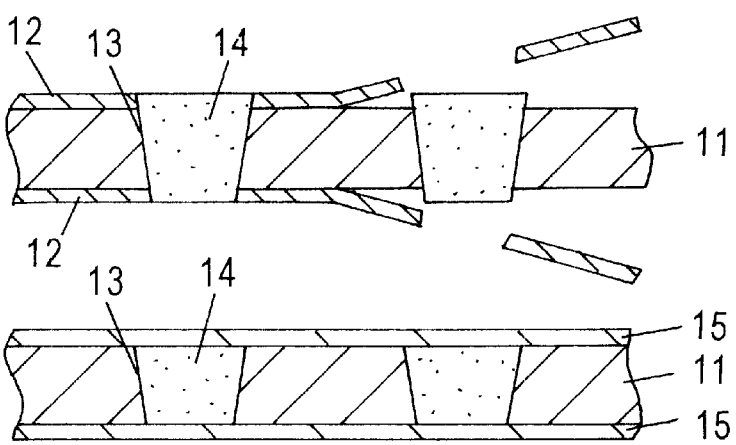
Figure 3E:
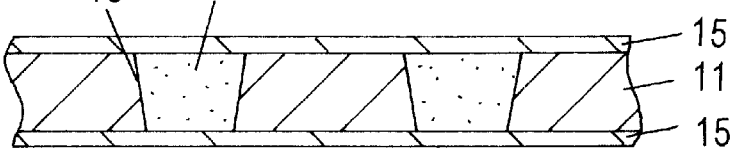
Figure 3F:
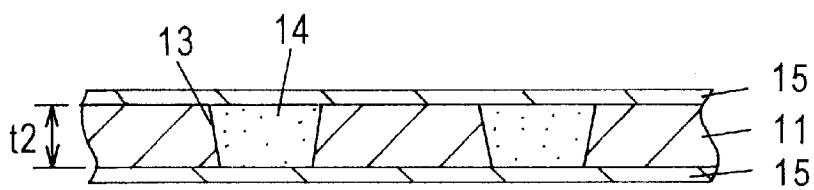
Figure 3G:
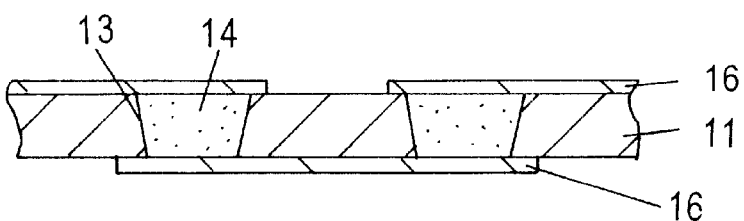
Figure 4A:
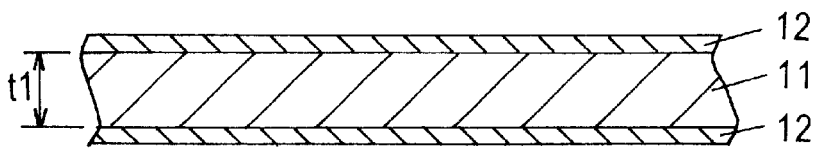
FIG. 4 is a cross-sectional view of a step for manufacturing a printed circuit board in another prior art.
Figure 4B:
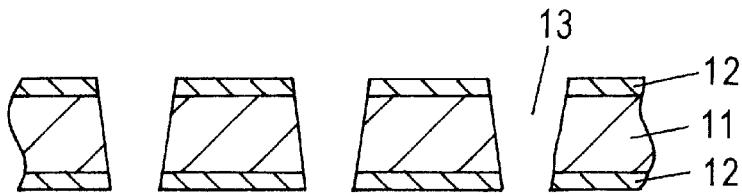
Figure 4C:
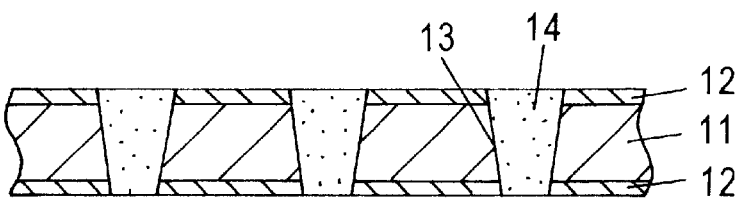
Figure 4D:
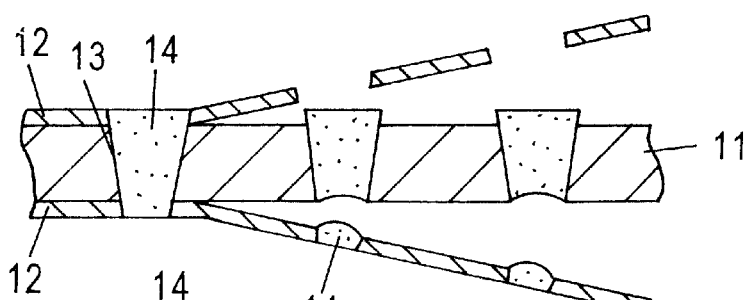
Figure 4E:
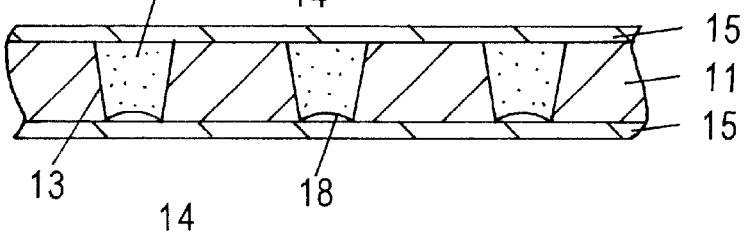
Figure 4F:
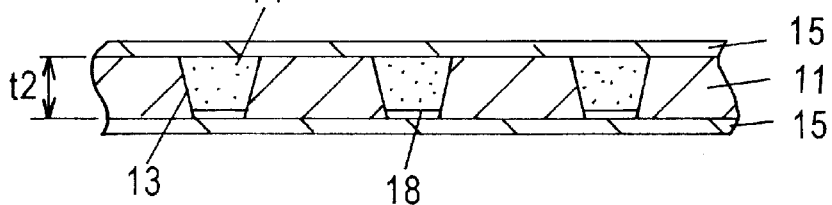
Figure 4G:
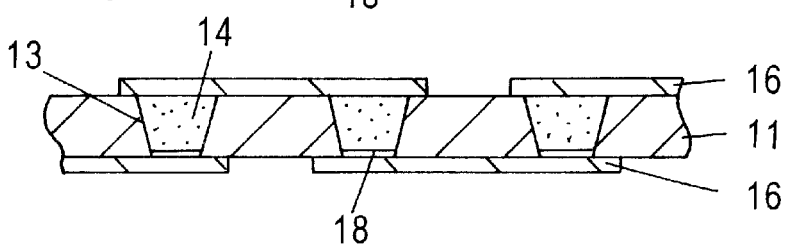

As described above, in this exemplary embodiment, the thickness of the first release film 2a is different from the thickness of the second release film 2b. Preferably, when through-hole 3 is formed by a laser beam, the laser beam is applied from the first release film 2a side where the film is thicker. In such hole forming process using a laser beam, as shown in FIG. 2(a), the opening in the first release film 2a is larger in diameter at the side exposed to the laser beam and gradually becomes smaller in diameter at positions closer to the second release film 2b. The reason why the hole diameter at the surface side is different from the hole diameter at the back side is the attenuation of the laser beam.

Also, as shown in FIG. 2(b) to FIG. 2(e), when first release film 2a and second release film 2b are formed of polymer film, shrinking of the film takes place around the opening of a through-hole due to the effect of heat in the laser operation. That is, affected layers 7a1, 7a2 having a mound are respectively generated at the top and bottom around the opening in the first release film 2a. Also, affected layers 7b1, 7b2 having a mound are respectively generated at the top and bottom around the opening in the second release film 2b. And, the relations between the opening diameter da of the first through-hole in the first release film 2a, the opening diameter db of the second through-hole in the second release film 2b, the initial thickness tfa of the first release film 2a, the initial thickness tfb of the second release film 2b, and the thicknesses "tha1," "tha2," "thb1," and "thb2" of respective affected layers 7a1, 7a2, 7b1 and 7b2 can be represented as follows:

$$(tha1 + tha2 + tfa)/da \leq 0.4$$
$$(thb1 + thb2 + tfb)/db \leq 0.4$$

In order to secure the above relations, each thickness of the first release film 2a and the second release film 2b is adjusted in relation with the desired through-hole diameter. In this case, it is necessary to make the first release film 2a thicker than the second release film 2b.

With the above configuration, it is possible to prevent increase in thickness at the openings formed in the first release film 2a and the second release film 2b. Particularly, it is possible to prevent increase in aspect ratio of through-holes 3a, 3b respectively formed in the first and second release films 2a, 2b, caused due to the inherent peculiarity of a laser beam such that the hole is formed smaller in diameter in the surface opposite to the side exposed to the laser beam. Accordingly, conductive paste 4 filled in the openings in these release films can be easily released from the through-holes when the release films are peeled, and with the release films 2a, 2b removed from the prepreg sheet 1, the conductive paste 4 of the first projected paste portion 4a and the second projected paste portion 4b is formed in convexity on either side of the prepreg sheet 1, projecting from the surface of prepreg sheet 1. As a result, metallic members such as first metallic foil 5a and second metallic foil 5b are reliably electrically connected to the conductive paste 4 of the projected portions 4a, 4b, and the first metallic foil 5a and the second metallic foil 5b are easily electrically connected to each other via the conductive paste 4. Further, the first metallic foil 5a and the second metallic foil 5b are reliably connected to the surface and back of prepreg sheet 1 respectively.

On the other hand, when the above relations are not satisfactorily secured, it is closely related to the thickness as against the hole diameter in the film, that is, the aspect ratio becomes increased, and consequently, the paste projecting from the prepreg surface cannot be easily released when the film is peeled.

As described above, the present exemplary embodiment will bring about the following advantages.

When a very small through-hole is formed to cope with a high-density circuit pattern, it is possible to prevent "conductive paste filled in through-holes in release film from being removed together with the release film" when the release film is peeled after filling the conductive paste into the through-hole. Especially, even when the desired through-hole is very small in diameter, it is possible to prevent "conductive paste in through-holes in release film from being removed together with the release film" by reducing the thickness of the release film. Accordingly, the conductive paste may be formed in convexity having a first projected paste portion and a second projected portion respectively on the surface and back of a prepreg sheet.

Further, in case a second release film is thinner, the amount of conductive paste formed in convexity projecting from the back (second surface) of a prepreg sheet will become less. However, it is possible to obtain a sufficient amount of paste projecting from the prepreg sheet by increasing the thickness of the second release film disposed on the surface (first surface) of the prepreg sheet. Therefore, the absolute amount of conductive paste filled into through-holes can be prevented from decreasing. Accordingly, the conductive paste will be reliably and precisely filled into through-holes. As a result, the conductive paste and metallic members are precisely electrically connected to each other after a step of compressing the prepreg sheet. Further, increase in electrical resistance between the metallic sheet disposed on the surface of the prepreg sheet and the metallic sheet disposed on the back of the prepreg sheet can be prevented. As a result, the first circuit pattern and the second circuit pattern will be precisely, reliably and electrically connected to each other.

As described above, with this configuration, in a printed circuit board with inner via-holes, a first circuit pattern disposed on the surface of a substrate and a second circuit pattern disposed on the back of the substrate may be precisely, reliably and electrically connected to each other by a conductive member (conductive member formed due to hardening of conductive paste) filled in the inner via-holes formed in the substrate (substrate formed due to hardening of a prepreg sheet). Further, even in the case of a printed circuit board having very small through-holes to cope with a high-density circuit pattern, increase in electrical resistance between the circuit pattern and the conductive paste can be prevented, and the circuit pattern and the conductive paste are precisely electrically connected to each other.

What is claimed is:

1. A method of manufacturing a printed circuit board, comprising the steps of:
    (a) disposing a first release film on a surface of a substrate, and disposing a second release film on a back surface of said substrate;
    (b) forming a through-hole through said first release film, said second release film and said substrate;
    (c) filling conductive paste into said through-hole;
    (d) peeling said first release film and said second release film from said substrate with said through-hole filled with said conductive paste;
    (e) placing a first metallic member on the surface of said substrate with said release films removed, and placing a second metallic member on the back surface of said substrate;
    (f) compressing under heat said substrate with said first metallic member and said second metallic member disposed thereon; and
    (g) forming a first circuit pattern on said first metallic member, and forming a second circuit pattern on said second metallic member,
    wherein a thickness of said first release film is greater than a thickness of said second release film;
    when said first release film is peeled, a first projected paste portion is formed, said first projected paste portion being projected from the surface of said substrate having said through-hole, and a second projected paste portion is formed,
    said second projected paste portion being projected from the back of said substrate having said through-hole; and
    said first metallic member is electrically connected to said first projected paste portion, and said second metallic member is electrically connected to said second projected paste portion.

2. The method of manufacturing a printed circuit board of claim 1, wherein
    said substrate includes a porous substrate having compressibility, and
    in said (f) step of compressing under heat said substrate with said first metallic member and said second metallic member disposed thereon,
    said substrate is compressed, hardened, and formed into a substrate decreased in thickness,
    said first metallic member is electrically connected to said conductive paste, and
    said second metallic member is electrically connected to said conductive paste.

3. The method of manufacturing a printed circuit board of claim 1, wherein
    said substrate includes a prepreg sheet;
    said prepreg sheet includes a porous substrate, and prepolymer with which said porous substrate is impregnated; and
    said prepreg sheet is compressed under heat, and hardened due to hardening of said prepolymer.

4. The method of manufacturing a printed circuit board of claim 1, wherein
    each of said first metallic member and said second metallic member is metallic foil.

5. The method of manufacturing a printed circuit board of claim 1, wherein
    said substrate includes a porous substrate having compressibility, and
    in said (f) step of compressing under heat said substrate with said first metallic member and said second metallic member disposed thereon,
    said substrate is compressed, hardened, and formed into a substrate decreased in thickness;
    said first metallic member is electrically connected to said conductive paste;
    said second metallic member is electrically connected to said conductive paste; and
    each of said first metallic member and said second metallic member is metallic foil.

6. The method of manufacturing a printed circuit board of claim 1, wherein
    a thickness of said first projected paste portion depends upon the thickness of said first release film;
    a thickness of said second projected paste portion depends upon the thickness of said second release film; and
    the thickness of said first projected paste portion is greater than the thickness of said second projected paste portion.

7. The method of manufacturing a printed circuit board of claim 6, wherein
    said step of forming said through-hole is performed by application of a laser beam;
    the laser beam is applied from the first release film side being greater in thickness toward said first release film, said substrate, and said second release film, and thereby, said through-hole in the first release film is formed larger in diameter than said through-hole in the second release film.

8. The method of manufacturing a printed circuit board of claim 7, wherein
said through-hole is about 200 µm or less in diameter.

9. The method of manufacturing a printed circuit board of claim 7, wherein
said first release film disposed on the side exposed to the laser beam is about 15 µm or over in thickness.

10. The method of manufacturing a printed circuit board of claim 7, wherein
said release film disposed on the back side of said substrate is about 20 µm or less in thickness.

11. The method of manufacturing a printed circuit board of claim 7, wherein
a relationship between thickness "th" of an affected layer generated around an opening portion of said through-hole formed in at least one release film out of said first release film and said second release film, thickness "tf" of said release film, and diameter "d" of an opening portion of said through-hole in said release film is represented by $(th+tf)/d \leq 0.4$.

12. The method of manufacturing a printed circuit board of claim 7, wherein
the laser beam is generated from at least one selected from the group consisting of a carbonic gas laser, YAG laser, and excimer laser.

13. The method of manufacturing a printed circuit board of claim 1, wherein
at least one release film out of said first release film and said second release film is formed of organic polymer film.

14. A method of manufacturing a printed circuit board, comprising the steps of:
(a) disposing a first release film on a surface of a substrate, and disposing a second release film on a back surface of said substrate;
(b) forming a through-hole through said first release film, said second release film and said substrate;
(c) filling conductive paste into said through-hole;
(d) peeling said first release film and said second release film from said substrate with said through-hole filled with said conductive paste;
(e) placing a first metallic member on the surface of said substrate with said release films removed, and placing a second metallic member on the back surface of said substrate;
(f) forming a first circuit pattern on said first metallic member, and forming a second circuit pattern on said second metallic member,
wherein a thickness of said first release film is greater than a thickness of said second release film.

15. The method of claim 14, further comprising the step of compressing under heat said substrate with said first metallic member and said second metallic member disposed thereon prior to performing step (f).

16. The method of claim 14, wherein said through-hole formed in said first release film, said second release film and said substrate have a trapezoidal configuration, having a diameter that decreases in the direction of the second release film.

17. The method of claim 16, wherein the diameter of the through-hole formed in said first release film is within a range of 20 µm to 200 µm.

18. The method of claim 16, wherein the thickness of said first release film is within a range of 15 µm to 30 µm.

19. The method of claim 16, wherein the thickness of said second release film is within a range of 5 µm to 20 µm.

20. The method of claim 14, wherein when said first release film is peeled, a first projected paste portion is formed, said first projected paste portion being projected from the surface of said substrate having said through-hole, and when said second release film is peeled, a second projected paste portion is formed,
said second projected paste portion being projected from the back of said substrate having said through-hole; and
said first metallic member is electrically connected to said first projected paste portion, and said second metallic member is electrically connected to said second projected paste portion.

* * * * *